United States Patent [19]

Ishikawa

[11] Patent Number: 4,697,044
[45] Date of Patent: Sep. 29, 1987

[54] CASING FOR ELECTRONIC DEVICES

[75] Inventor: Keisuke Ishikawa, Miyagi, Japan

[73] Assignee: Alps Electric Co., Ltd., Japan

[21] Appl. No.: 900,232

[22] Filed: Aug. 25, 1986

Related U.S. Application Data

[63] Continuation of Ser. No. 686,224, Dec. 26, 1984, abandoned.

[30] Foreign Application Priority Data

Dec. 26, 1983 [JP] Japan .......................... 58-200685[U]

[51] Int. Cl.$^4$ .............................................. H05K 9/00
[52] U.S. Cl. ................................... 174/35 R; 220/3.8
[58] Field of Search ............. 174/35 R, 52 R; 331/67, 331/68; 330/68; 361/424; 455/300, 301; 220/3.8

[56] References Cited

U.S. PATENT DOCUMENTS

| | | | |
|---|---|---|---|
| 2,272,178 | 2/1942 | McDowell et al. | 220/3.8 X |
| 2,827,507 | 3/1958 | Anderson | 455/300 X |
| 3,129,396 | 4/1964 | Germain et al. | 361/424 X |
| 3,187,281 | 6/1965 | Weiner et al. | 361/424 X |
| 3,234,318 | 2/1966 | Van Lieshout et al. | 174/35 MS |
| 4,066,837 | 1/1978 | Miura | 174/35 MS |

Primary Examiner—Arthur T. Grimley
Assistant Examiner—David A. Tone
Attorney, Agent, or Firm—Guy W. Shoup

[57] ABSTRACT

A casing for electronic devices is provided which includes a frame formed by a metal plate, a cover formed by a metal plate for covering an opening portion of the frame a shield plate for dividing a space in the frame, and a tip portion of the shield plate in contact with an inner surface of the cover. Projections are integrally formed on the cover so as to project toward a bottom plate of the frame, and the tip portion is in contact with the inner surface of the cover at portions where the projections are not formed, the cover being forcedly bent toward the frame by forming the projections on the cover to thereby contact the shield plate with the cover surely.

2 Claims, 8 Drawing Figures

CASING FOR ELECTRONIC DEVICES

This is a continuation application from application Ser. No. 686,224 filed Dec. 26, 1984 now abandoned.

BACKGROUND OF THE INVENTION

The present invention relates to electronic devices such as a RF (radio frequency) modulator, and particularly relates to a casing for receiving circuits constituting the devices therein to electrically shield the devices.

FIGS. 1(A) and 1(B) show cross sections of a typical example of a conventional casing for an electronic device.

In FIGS. 1(A) and 1(B), reference numeral 1 designates a frame formed by metal plates constituting side panels and a bottom panel of a casing. A circuit board 2 is fixedly mounted at a portion towards a rear opening in the frame 1. On the right half portion A of the circuit board 2 in FIG. 1(A), an input selection circuit is mounted, while on the left half portion B thereof a circuit constituting a RF modulator is mounted. The space within the frame 1 is divided into two sections by a shield plate 3 so as to electrically shield the input selection circuit from the RF modulator. The shield plate 3 is formed by bending a portion of the frame 1. As shown in FIG. 1(B), a tip portion of the shield plate 3 has two portions extending to the opening of the frame 1 past the circuit board. A tip portion of each of the two portions of the shield plate 3 is bent rectangularly thereby forming a contact portion 3a. A cover 4 formed by a metal plate is placed on the opening of the frame 1. The contact portions 3a are in contact with an inner surface of the cover 4 thereby grounding the shield plate 3 to the cover 4. Reference numerals 5a and 5b designate input and output connector plugs, respectively.

In the above-described conventional casing for electronic devices, the electric characteristics of the device vary greatly depending on whether the shield 3 is stably in contact with the inner surface of the cover 4 or not. However, in the conventional casing, since the main portion of the cover 4 is formed to be flat, the flat main portion is likely to be curved when forming the cover. As shown in FIGS. 2(A) and 2(B), if the main portion is curved outwardly, the cover 4 is away from the contact portions 3a of the shield plate 3 thereby electrically disconnecting the cover 4 from the shield plate 3. In this state, the shield characteristic of the casing is deteriorated thereby causing undesirable radiation of electric signals and the generation of cover noises.

SUMMARY OF THE INVENTION

An object of the present invention is to provide a casing for electronic devices which makes the electronic contact between the shield plate and the cover secure by a simple construction thereby stabilizing the shield characteristics thereof. To this end, the present invention provides a casing for electronic devices comprising a frame formed by a metal plate, a cover formed by a metal plate for covering an opening portion of the frame and a shield plate for dividing a space in the frame, and tip portions of the shield plate are in contact with an inner surface of the cover, wherein projections are integrally formed on the cover so as to project toward the frame, and the tip portions are in contact with the inner surface of the cover at portions where the projections are not formed. The cover is forcedly bent toward the frame by forming the projections on the cover thereby contacting the shield plate with the cover surely.

DESCRIPTION OF PREFERRED EMBODIMENT

A typical embodiment of the present invention will be explained referring to FIGS. 3 to 6.

Figure 1A:
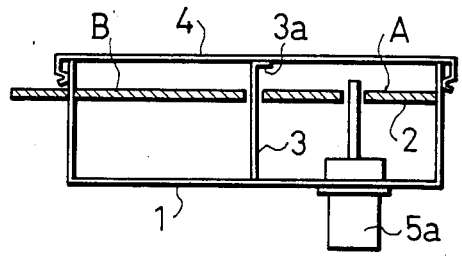
FIGS. 1(A) and 1(B) are a cross section of a conventinal casing for electronic devices.
Figure 1B:
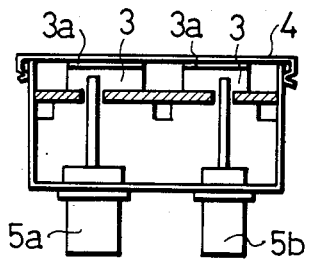
Figure 2A:
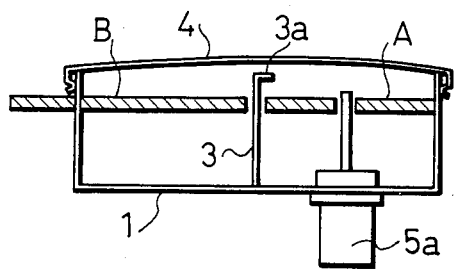
FIGS. 2(A) and 2(B) are a cross section of the conventional casing for explaining the drawbacks thereof.
Figure 2B:
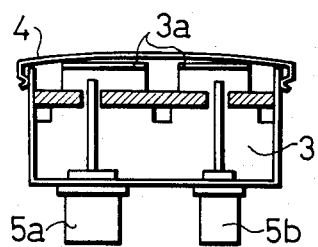
Figure 3:
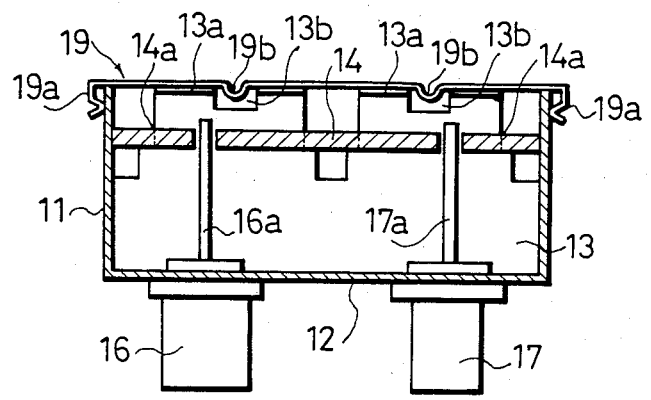
FIG. 3 is a cross section of a casing for electric devices according to the present invention.
Figure 4:
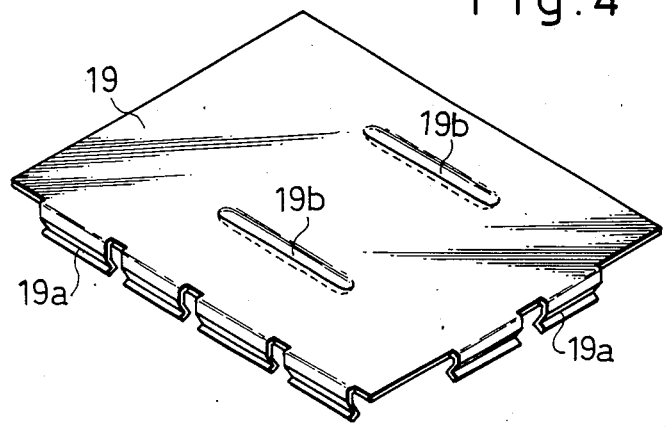
FIG. 4 is a perspective view of the cover shown in FIG. 3.

FIG. 3 shows a cross section of a casing for receiving electronic devices constituting a RF modulator with an antenna-booster-mixer or a RF modulator with an antenna-booster switch. FIG. 4 is a perspective view showing a cover of the casing, FIG. 5 a perspective view showing a frame of the casing and FIG. 6 a cross section of the cover.

In FIGS. 3 to 6, a reference numeral 11 designates a frame which is formed by a metal plate and covers four side surfaces of the casing for the electronic device. At the bottom side of the frame 11, a connector plug attachment plate 12 is formed by bending the frame 11. A part of the connector plug attachment plate 12 is bent perpendicularly thereby forming shield plates 13. The shield plates 13 split a space surrounded by the casing into two portions. One of the two portions (A in FIG. 5) receives an input selection circuit such as an antenna-booster-mixer, while the other of the two spaces (B in FIG. 5) receives a circuit constituting a RF modulator, and the frame 11 receives a circuit board 14. The circuit board 14 is supported by positioning projections 11a formed at the side panels and edge portions of the board and fixedly connecting them to an inner surface of the frame 11 through solder.

A series of communicating holes 14a are provided near the center of the circuit board 14. A tip portion of the shield plate 13 is split into two portions. The two portions of the shield plate extend toward the open side of the frame 11, which is positioned at an upper side of the frame 11 as shown in FIG. 3, through an associated one of the communicating holes 14a. At each of the split portions of the shield plate 13, a contact portion 13a is formed by bending the tip portions of the shield plate 13 substantially perpendicularly. Each of the contact portions 13a is provided with a recess portion 13b almost at the center thereof thereby splitting each of the contact portions 13a into two parts.

The connector plug attachment plate 12 is provided with an input connector plug 16 and as output connector plug 17. Terminals 16a and 17a for the input and output connector plugs are soldered at portions on the input selection circuit side A of the circuit board 14.

Figure 5:
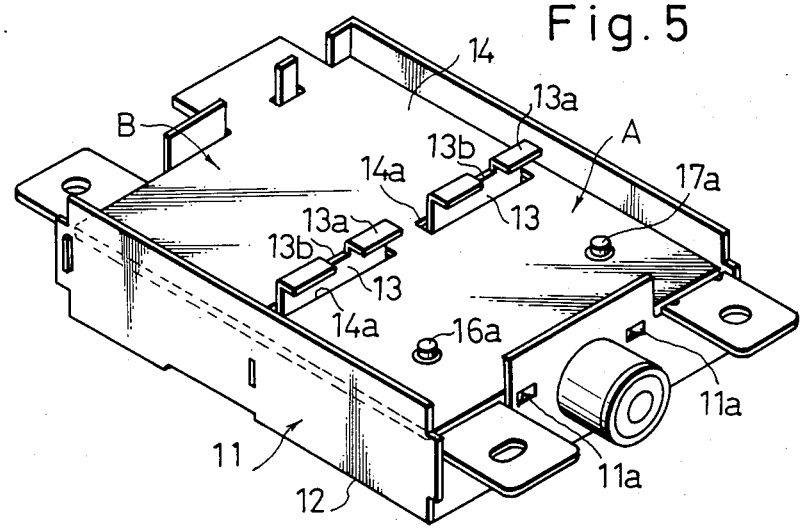
FIG. 5 is a perspective view of the frame shown in FIG. 3.

A cover 19 formed by a metal plate is attached to the opening portion of the frame positioned at the upper side thereof in FIGS. 3 to 5. Pressing rail portions 19a are integrally formed at the edge portions of the cover 19. At two portions of the main surface of the cover, two projections 19b are formed so as to project toward the panel 12. The projections 19b are formed into elongated configurations by pressing the two portions of the main surface of the cover 19 from upper side thereof. For attaching the cover 19 to the opening portion of the frame 11 as shown in FIG. 3, the cover 9 is fixedly attached to the frame 11 by fitting the pressing rail portions 19a to the outer surfaces of the side panels of the frame 11. In this case, the projections 19b fit in the recesses 13b provided at the upper portion of the shield plate 13. The contact portions 13a positioned at both sides of the recess 13b are placed in contact with portions at both sides of the associated projection 19b on the inner surface of the cover 19. The cover 19 may also be attached to the bottom side of the frame 11 instead of the upper side thereof, as another construction.

The functions of the above described casing for an electronic device will be explained.

Figure 6:
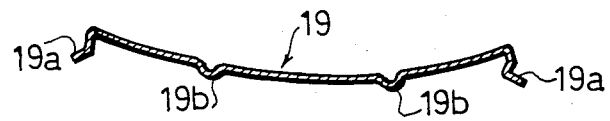
FIG. 6 is a cross section of the cover.

The cover 19 is formed by a metal plate. In the process of forming the cover or after defining the shape thereof, the projections 19b are formed by pressing the main surface of the cover 19. Since the projections 19b are formed so as to project toward the plate 12, the cover 19 is bent toward the plate 12 as shown in FIG. 6 due to a residual stress caused by the formation of the projections 19b. Therefore, in a state where the cover 19 is attached to the flame 11, the inner surface of the cover 19 is pressed by the contact portions 13a thereby contacting each other firmly. Particularly, when the contact portions 13a are in contact with both sides of the projections 19b of the lower surface of the cover as shown in FIGS. 3 to 5, the contact state between the cover 19 and the contact portions 13a is improved more stably because the curvature at the projections 19b is at its largest thereby effectively pressing the cover 19 to the contact portions.

Now, a plurality of bosses may be disposed and modified on the main surface of the cover so as to form other projections instead of the elongated projections 19b.

Thus, according to the present invention, since the projections are formed on the surface of the cover, the cover is forcedly bent toward the bottom plate of the frame opposing to the cover due to a residual force caused by the formation of the projections. Thus, when the cover is attached to the frame, the tip portion of the shield plate is kept in contact with the inner surface of the cover stably, thereby improving the shielding characteristics of the casing to surely prevent undesirable radiation and insufficient electric isolation. Further, a process required for improving the electric characteristics is merely to form projections in the cover, so that the casing can be formed by a simple process and with a low cost.

I claim:

1. In a casing for electronic devices of the type having a frame formed by a metal plate which is open at an upper end, a cover formed by a metal plate attached by its ends to the frame for covering the open upper end of the frame, and at least one shield plate disposed within the frame extending in a longitudinal direction thereof for dividing the interior of the frame into at least two parts, the shield plate having an upper tip portion adapted to be placed in contact with and to support an inner surface of the cover when the cover is mounted to the frame, the improvement wherein said cover is formed with a plurality of parallel, elongated bossed projections pressed into the metal plate of said cover facing in a downward direction relative to said frame, and said cover thereby being further provided with a bowed shape facing in the downward direction, whereby said inner surface of said cover, excluding the area of said projections, is pressed securely into contact with said tip portion of said shield plate when said cover is mounted to said frame, wherein said plurality of parallel projections are pressed in said cover extending in a direction transverse to the longitudinal direction of said shield plate, and said tip portion of said shield plate is divided into a corresponding plurality of sections each having a recess therein to accomodate a respective one of said projections, said casing containing a circuit board for mounting electronic devices thereon, and said plurality of tip sections of said shield plate extending upward through corresponding holes formed in said circuit board to contact said inner surface of said cover.

2. A casing for electronic devices according to claim 1, wherein an end of each of said tip sections is formed by a contact portion bent substantially at a right angle to said upwardly extending tip section and pressed in contact with said inner surface of said cover, said contact portion being divided into two contact parts with the recess of said tip section formed substantially in the center thereof to accomodate the respective projection therein.

* * * * *